US008193738B2

(12) United States Patent
Chu et al.

(10) Patent No.: US 8,193,738 B2
(45) Date of Patent: Jun. 5, 2012

(54) DIMMABLE LED DEVICE WITH LOW RIPPLE CURRENT AND DRIVING CIRCUIT THEREOF

(75) Inventors: Chung-Jen Chu, Shanhua Township, Tainan County (TW); Yi-Jing Chen, Shanhua Township, Tainan County (TW); Hung-Chun Chung, Shanhua Township, Tainan Coutny (TW)

(73) Assignee: Phihong Technology Co., Ltd., Taoyuan County (TW)

(*) Notice: Subject to any disclaimer, the term of this patent is extended or adjusted under 35 U.S.C. 154(b) by 435 days.

(21) Appl. No.: 12/537,801

(22) Filed: Aug. 7, 2009

(65) Prior Publication Data

US 2011/0031899 A1 Feb. 10, 2011

(51) Int. Cl.

| | |
|---|---|
| ***H05B 37/02*** | (2006.01) |
| ***H05B 33/08*** | (2006.01) |
| ***H03K 17/16*** | (2006.01) |

(52) U.S. Cl. .................... 315/307; 363/21.17; 363/21.15

(58) Field of Classification Search .................. 315/307, 315/247, 312, 291, 225, 354; 363/21.17, 363/21.15

See application file for complete search history.

(56) References Cited

U.S. PATENT DOCUMENTS

| | | | | |
|---|---|---|---|---|
| 6,577,512 | B2 * | 6/2003 | Tripathi et al. | 363/21.17 |
| 2007/0267984 | A1 * | 11/2007 | Peng | 315/312 |
| 2008/0278092 | A1 * | 11/2008 | Lys et al. | 315/247 |

* cited by examiner

*Primary Examiner* — Daniel D Chang

(74) *Attorney, Agent, or Firm* — Muncy, Geissler, Olds & Lowe, PLLC

(57) ABSTRACT

A dimmable light emitting diode (LED) device with low ripple current includes a LED module, a phase dimmer, a voltage converting module, a driving module and a feedback module. The flyback converter of the voltage converting module adds a secondary forward winding connecting to a phase cut-off detector to provide a detecting voltage in proportion to current level of the output current across the LED module.

19 Claims, 6 Drawing Sheets

DIMMABLE LED DEVICE WITH LOW RIPPLE CURRENT AND DRIVING CIRCUIT THEREOF

FIELD OF THE INVENTION

The present invention relates generally to a light emitting diode (LED) device and, more particularly, to a low ripple current dimmable LED device and its driving circuit.

BACKGROUND OF THE INVENTION

The light intensity of conventional lamps is mainly controlled by their input current. Therefore, a dimmable lamps based on the conventional technique which was utilizing an AC light dimmer to modulate the phase of input AC voltage then output a phase-modulating AC voltage. Users can use a control device on the AC light dimmer to control the alternating light dimmer, modulate the phase of AC voltage, and enable the phase-modulating AC voltage for dimming brightness or intensity.

The brightness of the lamp is determined by the output phase-modulating AC voltage from the AC light dimmer. If the voltage level becomes lower after modulating the phase of the AC voltage, the light intensity of the lamp will become dimmer; on the contrary, if the voltage level becomes higher, the light intensity of the lamp will become brighter Nowadays, LED lighting devices has gradually replaced the conventional light bulbs or lamps, the brightness of the LEDs is proportional to their induced current. As a consequence, to adjust the current output from the LED driving device to the LED will regulate the output light intensity. However, the ways of driving conventional light lamps are different from the LED lighting devices. It is not easy for users to regulate the intensity of the LED lighting devices, so the conventional way of using AC light dimmer is not suitable for operating the LED lighting devices.

Typical prior art, phase-modulating LED driver with flyback converter can only allow the usage of input/output capacitors with small capacity for phase-modulating light dimming. The main drawback of the usage of input/output capacitors with small capacity is that the output ripple current will cause the LEDs overheated and shorten their lifetime, even further result an unstable output and led to light flicking.

Accordingly, a modification of the above LED driver circuit remains needed for increasing input/output capacitance and reducing the output ripple current of the LEDs.

SUMMARY OF THE INVENTION

In accordance with a preferred embodiment of the present invention, there is provided a dimmable LED device with a driver circuit for reducing the output ripple current.

Exemplary embodiments of the present invention disclose a dimmable LED driving circuit for reducing the output ripple current. An exemplary embodiment LED driving circuit comprises: a phase-modulating module, modulating the phase of an AC power to obtain an AC voltage; a voltage-converting module coupled to the phase-modulating module for converting the phase-modulating voltage to a first DC voltage; a driving module coupled to the voltage module for receiving a first DC voltage to drive a LED module and base on the phase-modulating information of the phase dimmer module to control a output current of the LED module; the voltage-converting module includes a flyback converter, the flyback converter includes at least a secondary forward winding to provide a detection voltage as a reference level for the output current of the LED module.

Another exemplary embodiment of the present invention also discloses a dimmable LED device for reducing the output ripple current. In an exemplary embodiment, a dimmable LED device comprises: a LED module; a phase-modulating module, modulating the phase of an AC power to obtain an AC voltage; a voltage-converting module coupled to the phase-modulating module for converting the phase-modulating voltage to a first DC voltage; a driving module coupled to the voltage module for receiving a first DC voltage to drive a LED module and base on the phase-modulating information of the phase dimmer module to control a output current of the LED module; a feedback module, coupled to the driving module and the LED module, to measure the output current and provide the information about the output current for regulating the output current of the LED module; the voltage-converting module includes a flyback converter, the flyback converter includes at least a secondary forward winding to provide a detecting voltage as a reference level across the output current of the LED module.

In an exemplary embodiment, inside the LED device has a secondary forward winding and a phase cut-off detection circuit added for providing an output current reference level which can enable the reduction of output ripple current.

In an exemplary embodiment, the LED lighting device enable the flyback converter with dimmable light intensity ability to increase the output capacity greatly and reduce output ripple current which can stabilize the LED's output light intensity. Therefore, the lifetime of LED can be extended and the degraded of flicker index can also be avoided.

In addition, in an exemplary embodiment, there is no need for applying micro controller unit (MCU) to control the gain of the dimmable light. Therefore, the range of the dimmable light level will be increased, the power consumption also be reduced, and can be matched to the existing dimmer or lighting infrastructure.

In an exemplary embodiment, to utilize the secondary analog control circuit for dimming light, no additional isolation device (such as optocoupler) is needed, which is different from the primary (input) detection technique and can satisfy the need for miniaturization and simplification.

DESCRIPTION OF THE SYMBOLS OF THE MAIN ELEMENTS

100 a LED device;

110 a phase dimmer module;

120 a voltage converting module;
122 a bridge-rectifier;
124 a flyback converter;
126 a phase cut-off detecting unit;
130 a driving module;
132 a power factor correction IC;
140 a LED module;
150 a feedback module;
152 a control unit; and
106 an optocoupler feedback unit.

DETAILED DESCRIPTION OF THE PREFERRED EMBODIMENT

Reference will now be made in detail to embodiments of the present invention, examples of which are illustrated in the accompanying drawings.

In the present invention, a LED driver based on a single stage power factor correction flyback (PFC-Flyback) converter circuit is fabricated. Utilizing line voltage amplitude and waveform to regulate the input current will reduce the phase and waveform distortion between the input current and the in-line voltage and increase the power factor. This will greatly reduce the virtual work dispassion and energy consumptions, therefore obtain the purpose of energy-saving.

As mentioned above, in the present invention, the LED driving circuit is based on the single stage PFC-Flyback converter circuit which is suit for regulating the light intensity on the phase-modulating dimmer of the line voltage. Either the leading or trailing edge of the input voltage signal has been cut-off by the phase dimmer module, the output current of the LED driver will be instantly and in phase cut-off, therefore allowing the opto-output of the LED been reduced with the same ratio.

In the present invention, the driving circuit of the LED device has a secondary forward winding and a phase cut-off detection circuit added on the flyback converter for detecting the phase cut-off period on the dimmer output and regulating the output current reference level in phase. It can increase the output capacity of the single stage PFC-Flyback converter with phase-modulating function and reduce the output ripple current of the LED device.

Figure 1:
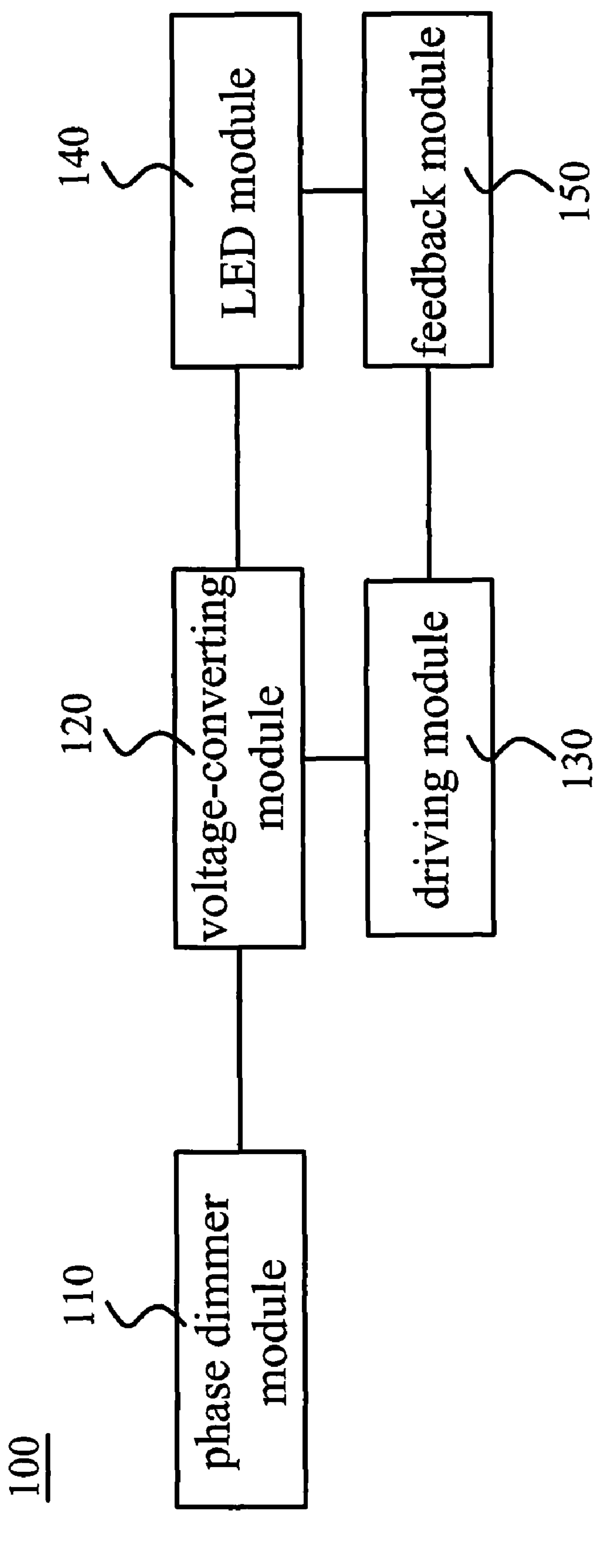
FIG. 1 is a block diagram of a dimmable light emitting diode (LED) device with low ripple current.

In the present invention, referring to FIG. 1, it demonstrated a block diagram of a dimmable LED device 100 with low ripple current. The LED device includes a phase dimmer module 110, a voltage-converting module 120, a driving module 130, a LED module 140, and a feedback module 140.

After regulating the voltage phase of the line AC power source through the phase dimmer module 110 the AC voltage has been converted into a DC voltage by the voltage-converting module 120. Converted DC voltage provides the driving force to the driving module 130 and LED module 140 for driving the LED module 140 and regulating the light intensity (output current) of the LED module 140. In accordance to the phase-modulating information provided by the phase dimmer module 110, the driving module 130 can control the output current of the LED module through the voltage-converting module 120. The feedback module 150 can detect the output current of the LED module 140 and provide its output current to the driving module 130 for regulating the output current and maintain a predetermined value.

The phase dimmer module 110, in an exemplary embodiment, includes an off-line phase dimmer, is used for phase modulating the input AC voltage or current. The voltage-converting module 120 is used for voltage converting, it converted the input voltage to another state (for example convert an AC voltage into DC voltage). In an exemplary embodiment, the voltage-converting module 120 includes a bridge-rectifier and a flyback converter. The voltage-converting module 120 couples to the phase dimmer module 110 converting the phase-modulated AC voltage into same or different level DC voltage. The bridge-rectifier converts the phase-modulated AC voltage into DC voltage then transfer the DC voltage to the LED module through the flyback converter.

The driving module 130 is acted as driver for driving the LED module 140 and control the output current of the LED. The driving module 130 couples to the voltage-converting module 120 and the feedback module 150 receiving the converted DC voltage from the voltage-converting module 120, based on the phase-modulating information converted the driving module can control the LED module 140. In an exemplary embodiment, the driving module comprises: a PFCIC and a power switch. In addition to reducing the dissipation during the voltage converting and increasing the power factor of the circuit, the PFCIC can also provide a on-off signal to the power switch to drive the LED module. The power switch is based on the on-off signal to control the voltage converting frequency of the flyback converter inside the voltage converter 120 to control the LED module 140.

The feedback module 150 is utilized to provide the information of the output current of the LED 140 into the driving module 130. The driving module 130 can regulate the output voltage of the LED 140, based on the information of the feedback output current, and maintain the predetermined value. In an exemplary embodiment, the feedback module 150 includes a feedback resistor, a control unit, and a optocoupler feedback unit. The feedback resistor couples to the LED module 140 for detecting the output current of the LED module 140. The control unit 152, based on the output current information that provided by the feedback resistor, transmits the control signal to the optocoupler feedback unit. The control signal is converting into a optical signal through the optocoupler feedback unit and transmits into the driving module 130. The circuit is shown in FIG. 2.

Figure 2:
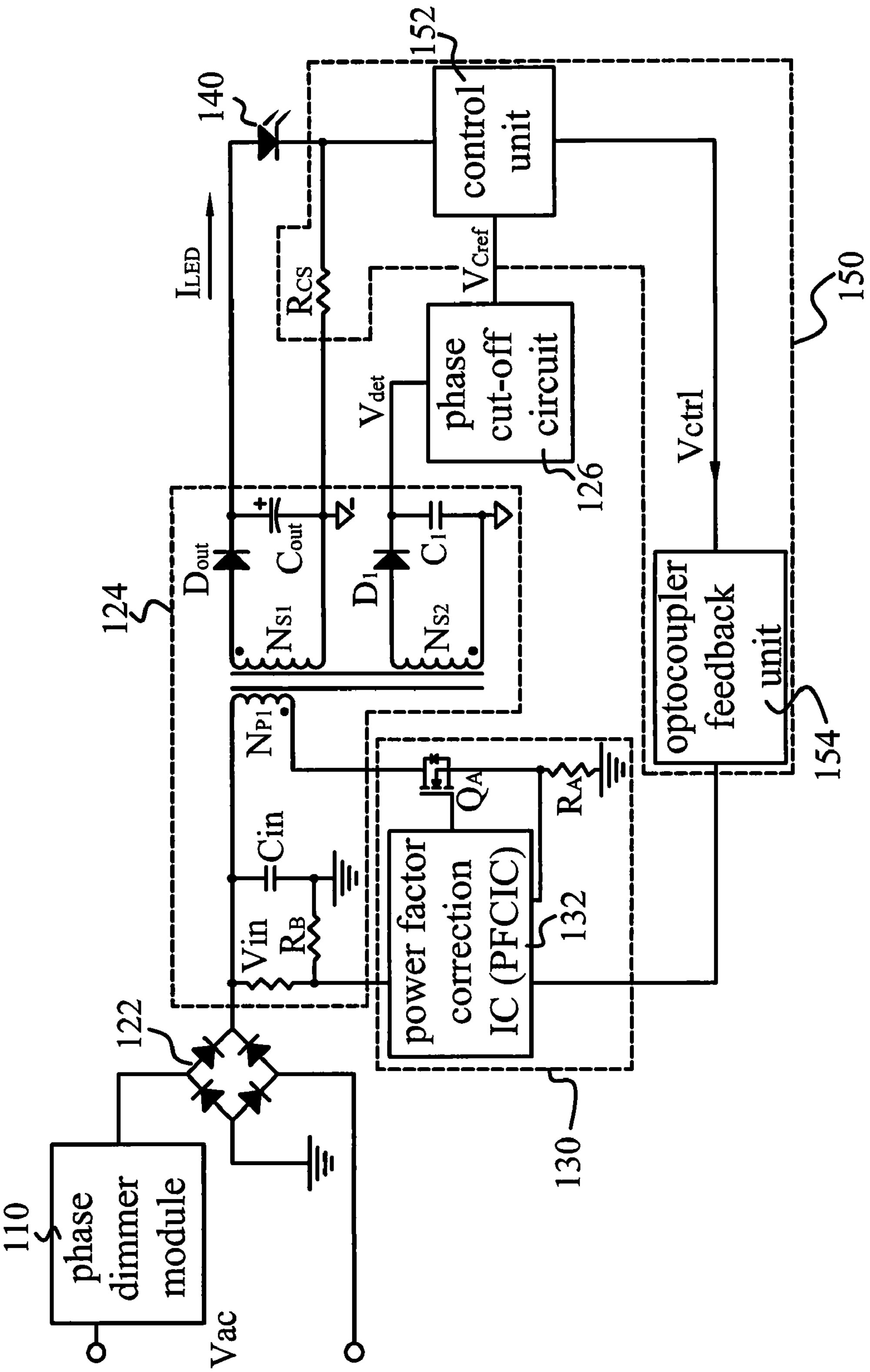
FIG. 2 is circuit diagram of a dimmable LED device with low ripple current.
Figure 3:
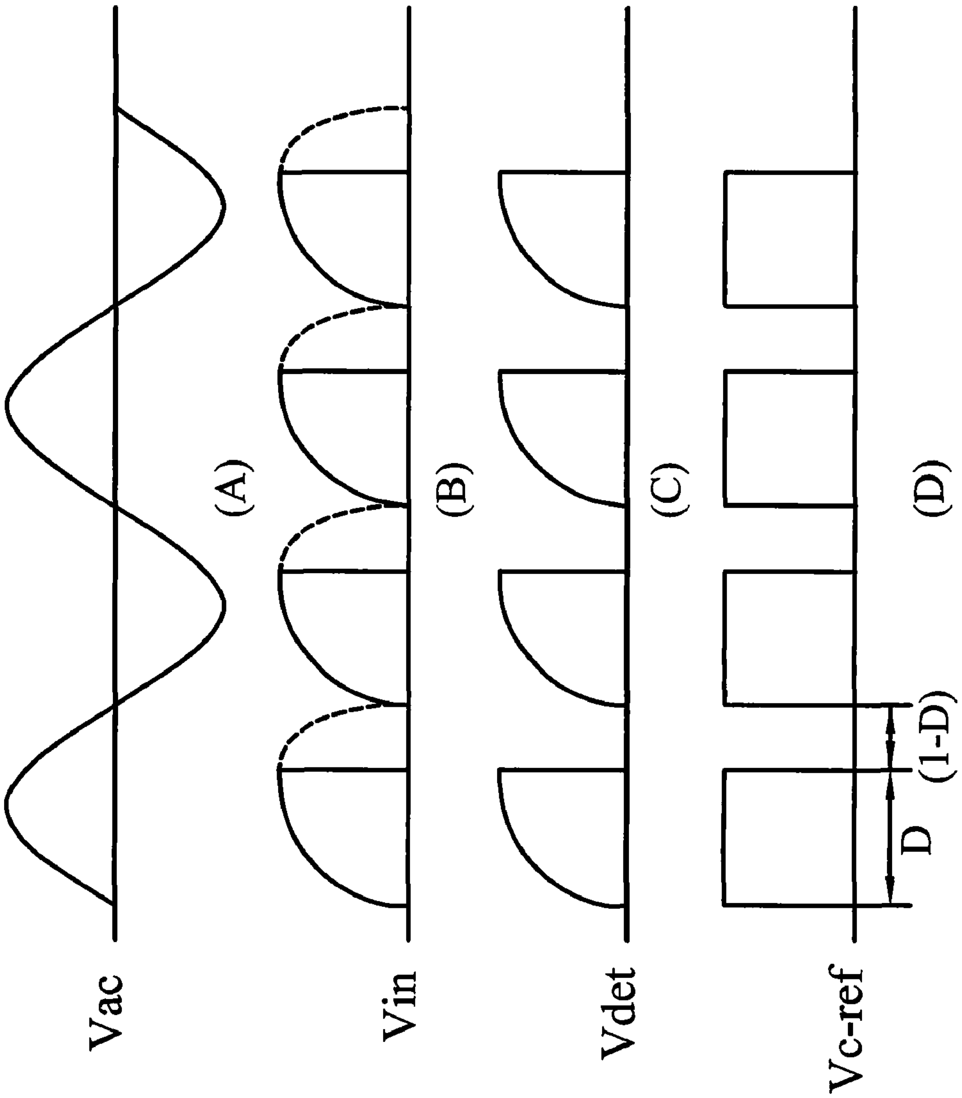
FIG. 3(*a*)-(*d*) are the waveforms of the AC input voltage $V_{ac}$ that indicated in FIG. 2.

In an exemplary embodiment, FIG. 2 showed the circuit of dimmable LED device 100 with low ripple current. The in-line power supply provides an AC voltage $V_{ac}$ (as shown in FIG. 3(A)) to the phase-dimmer module 110 and will modulate an phase-modulating AC voltage.

The voltage-converting module 120 includes a bridge-rectifier 122, a flyback converter 124, and a phase-detecting cut-off circuit 126. The bridge-rectifier is located between the phase-dimmer 110 and the flyback converter 124, the AC voltage go through phase-modulating process, has been cut-off by part of the phase by the phase-dimmer 110, and transmit to the bridge-rectifier 122 for rectifying into a first DC current $V_{in}$ (as shown in FIG. 3(B)).

The flyback converter 140 connects to the bridge-rectifier 122 which is receiving the first DC current $V_{in}$ and transforming into a second DC current and output into the LED module 140. The flyback converter includes a primary forward winding $N_{P1}$, a secondary forward winding, and a secondary reverse winding $N_{S2}$. Diodes $D_{out}$, $D_1$ and capacitors $C_{in}$, $C_{out}$, and $C_1$ are used for filtering and rectifying signals. The primary forward winding $N_{P1}$ is magnetic coupled to the secondary forward winding $N_{S1}$ and the secondary reverse winding $N_{S2}$. The flyback converter 124 receives the first DC voltage $V_{in}$ through the primary forward winding $N_{S1}$ and converts the level of the first DC voltage into a second DC voltage and output the second DC voltage to the secondary forward winding $N_{S1}$.

The diode $D_{out}$ has been reversed cut-off while the primary forward winding $N_{P1}$ conducting, therefore no voltage output into the LED module 140. The primary forward winding will provide a reverse potential to the secondary reverse winding $N_{S1}$ and the LED module 140 while the primary forward winding being cut-off.

The secondary forward winding $N_{S2}$ coupled to a phase cut-off detecting circuit 126. When the primary and the secondary winding of the transformer has Np1 and Ns2 winding loops, respectively. According to the principle of transformer, the detected voltage of the secondary forward winding $N_{S2}$ (FIG. 3) can be expressed as $$V_{det}=V_{in}*Ns2/Np1;$$

The detected voltage $V_{det}$ will produce a reference voltage $V_{c\text{-}ref}$ (as shown in FIG. 3(D)) after being processed by the phase cut-off detecting circuit 126, this is acted as a reference level of the output current $I_{LED}$ of the LED module 130. In referring to FIG. 3(D), the level of reference voltage $V_{c\text{-}ref}$ is IHL while the conducting period is D (D≦1); the level of reference voltage $V_{c\text{-}ref}$ is ILL while the conducting period is 1−D. Therefore, the output current $I_{LED}$ of the LED module 140 can be regulated by the voltage conducting angle ratio and the purpose of dimming light intensity can be obtained. The output current $I_{LED}$ of the LED module can be calculated by the formula $$I_{LED}=IHL*D+ILL*(1-D).$$

Figure 4:
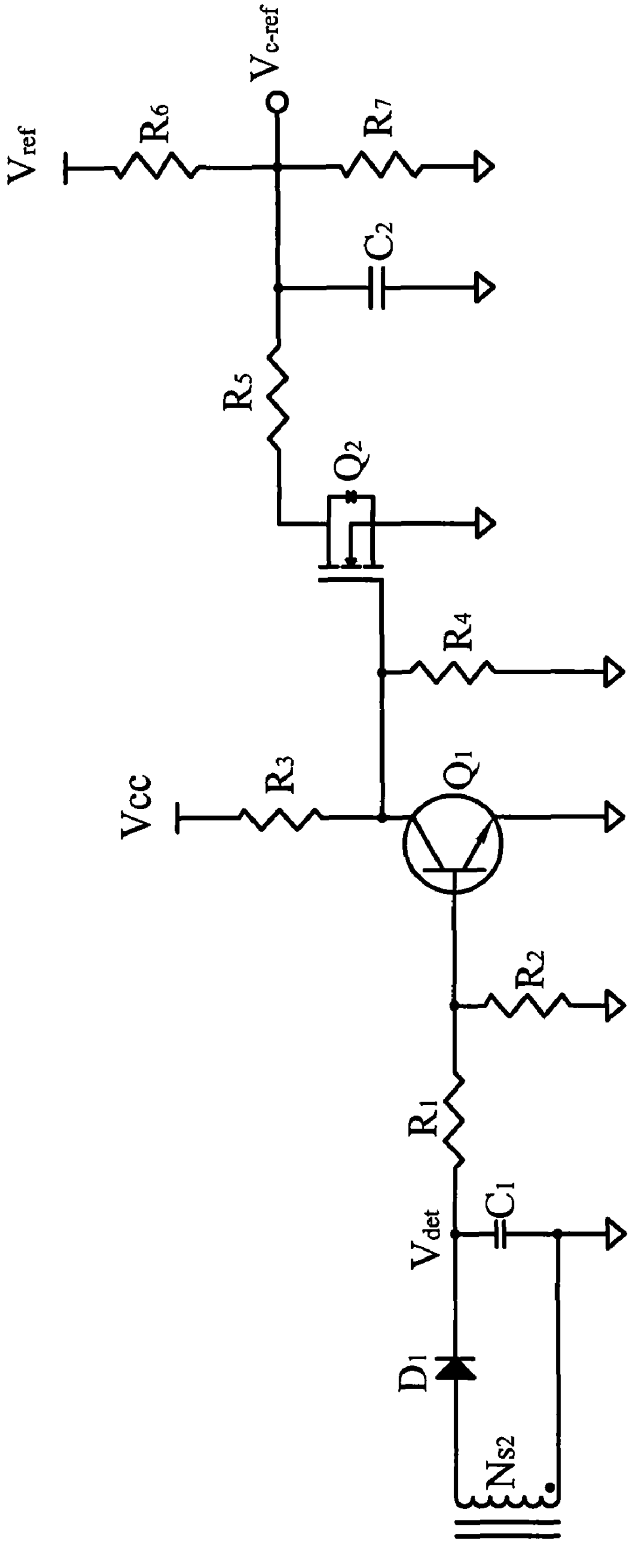
FIG. 4 is the circuit diagram of the phase cut-off detecting circuit in FIG. 2.

Referring to FIG. 4, in an exemplary embodiment, is circuit diagram of the phase cut-off detecting circuit 126. A first end of a first resistor $R_1$ connects to a diode $D_1$ and a capacitor $C_1$, a second end of the first resistor connects to the first end of a second resistor $R_2$. A second end of the second resistor connects to the ground. The base of a first transistor $Q_1$ connects to the first end of the second resistor $R_2$ and the emitter of the first transistor $Q_1$ connects to the ground. A first end of the third resistor $R_3$ connects to a first power supply $V_{cc}$ and a second end of the third resistor $R_3$ connects to the collector of the first transistor $Q_1$. A first end of the fourth resistor $R_4$ connects to the collector of the first transistor $Q_1$ and the second end of the third resistor $R_3$, the second end of the fourth resistor $R_4$ connects to the ground. The gate of the second transistor $Q_2$ connects to the first end of the fourth resistor $R_4$, the source of the second transistor $Q_2$ connects to the ground. The first end of the fifth resistor $R_5$ connects to the drain of the second transistor $Q_2$, the second end of the fifth resistor connects to the output of the phase cut-off detecting circuit 126. The first den of the second capacitor $C_2$ connects to the second end and the output of the phase cut-off detecting circuit 126, the second of the second capacitor connects to the ground. The first end of the sixth resistor $R_6$ connects to a second power supply $V_{ref}$, the second end of the sixth resistor connects to the output of the phase cut-off detecting circuit 126. The first end of the seventh resistor $R_7$ connects to the output of the phase cut-off detecting circuit 126 and the second end of the seventh resistor $R_7$ connects to the ground.

The phase cut-off detecting circuit 126 connects to the secondary winding $N_{S2}$. The detecting voltage $V_{det}$ of the secondary winding $N_{S2}$, filtering and rectifying by the diode $D_1$ and the capacitor, can equal-ratio sampling the waveform of the first DC voltage coming from the primary forward winding. After voltage divided by the resistors $R_1$ and $R_2$, the $V_{det}$ input into the gate of the first transistor $Q_1$. If the voltage of $R_2$ small than the gate voltage $V_{BEO}$ (about 0.6 volt), then the transistor $Q_1$ is conducting and the transistor $Q_2$ is cut-off. This will lower the output reference voltage of the phase cut-off detecting circuit 126. Therefore, the current level that output to $I_{LED}$ will also lower with equal-ratio and reduce the ripple components of the output current $I_{LED}$ efficiently.

The power factor correction integrated circuit (PFCIC) 132 coupled to the bridge-rectifier 122 for increasing the efficiency during the voltage converting process and the power factor of the voltage converting module 120. The power switch $Q_A$ connects between the flyback converter 124, the primary forward winding $N_{P1}$, and the PFCIC 132, the PFCIC 132 transmits the on-off signals to the power switch $Q_A$ to control the flyback converter 124 and the output current $I_{LED}$ of the LED 140.

Figure 5:
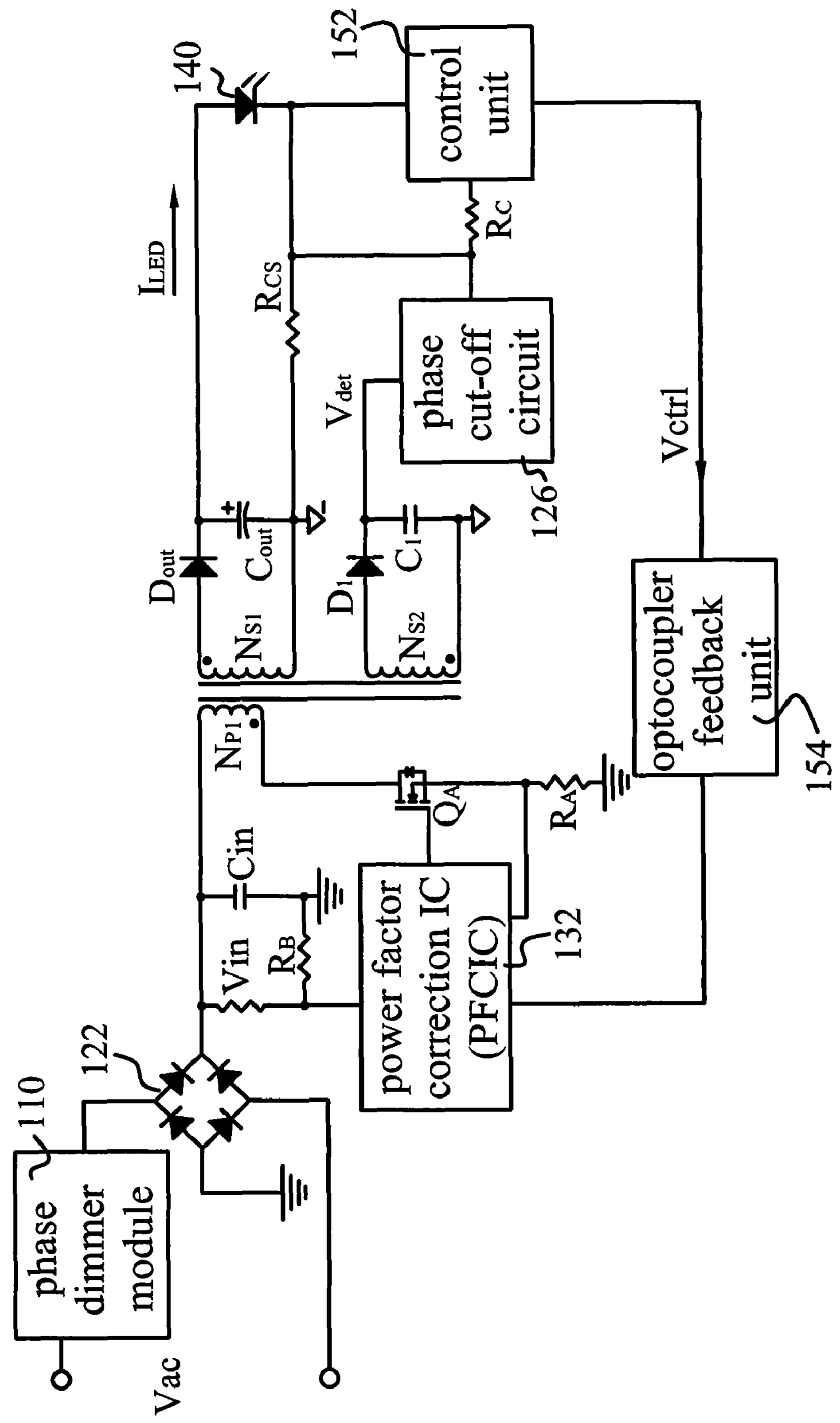
FIG. 5 is the circuit diagram for lowering ripple current of the dimmable LED device.

The feedback resistor $R_{cs}$ connects to the LED module 140 to detect the output current $I_{LED}$ of the LED module 140 and produce a feedback voltage for regulating the value of the output current $I_{LED}$ in a predetermined range. The control unit 152 connects to the feedback resistor $R_{cs}$, LED module 140, the phase cut-off detecting circuit 126, and the optocoupler feedback unit 154. Based on the feedback voltage provided by the feedback resistor Rcs and the reference voltage provided by the phase cut-off detecting circuit, the control unit 152 produces a control signal Vcrtl to regulate the output current $I_{LED}$. The optocoupler feedback unit 152 receives the control signal $V_{ctrl}$ from the control unit and converts into optical signal then send it into the PFCIC 132. In an exemplary embodiment, the output of the phase cut-off detecting circuit 126 can also connect to feedback resistor $R_{cs}$, as shown in FIG. 5.

Figure 6:
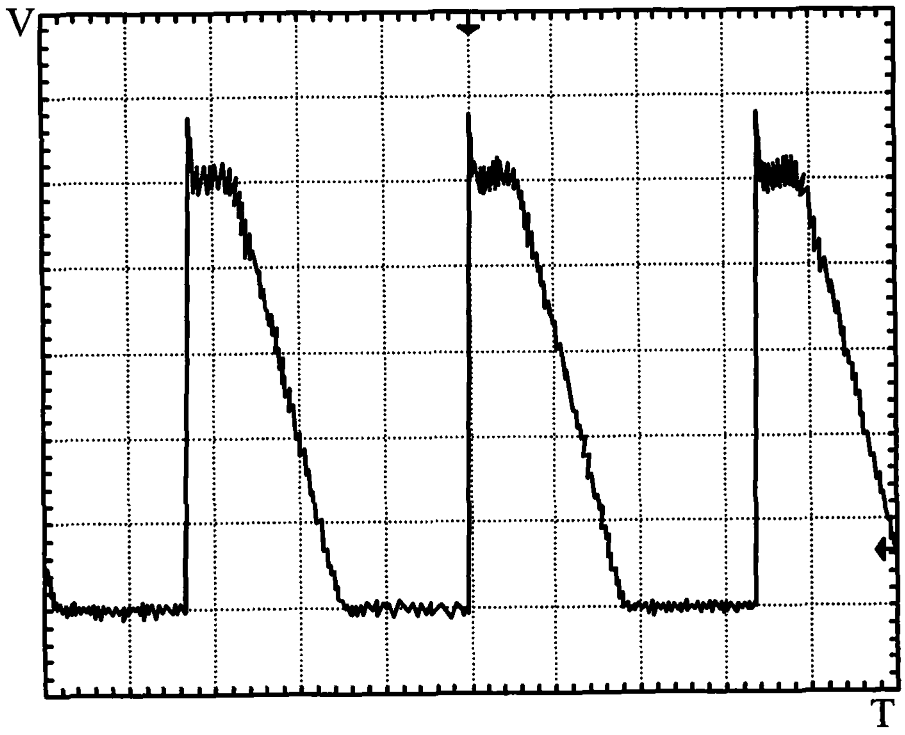
FIG. 6 is the illustration of the output current $I_{LED}$ of the LED device of the prior art.
Figure 7:
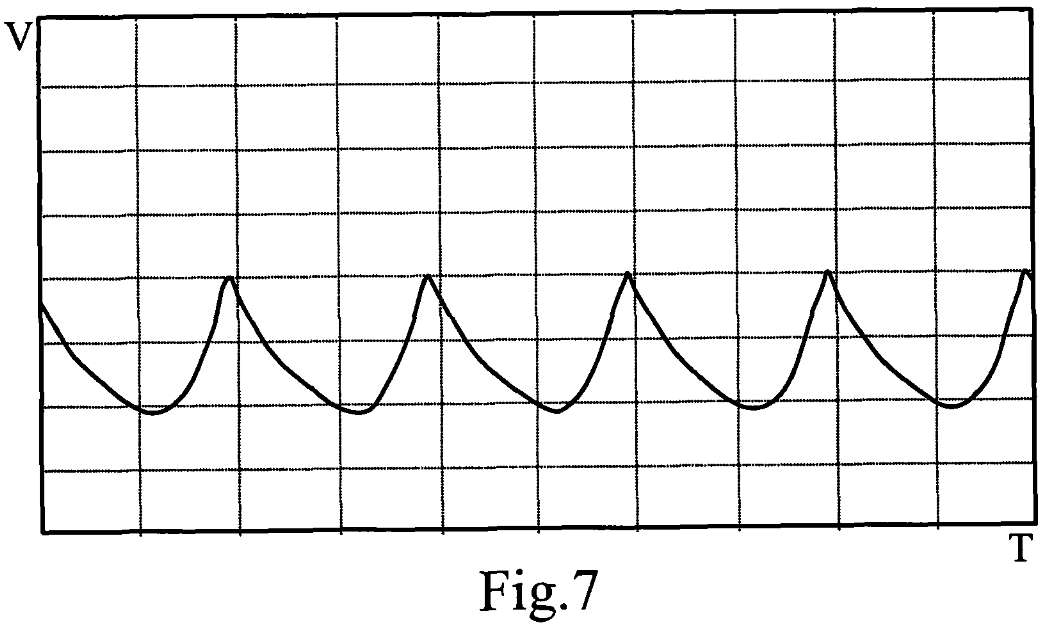
FIG. 7 is the output current $I_{LED}$ of the LED device with low ripple current of the present invention.

In the present invention, adding a secondary forward winding and a phase cut-off detecting circuit on the transformer of the single stage high power factor flyback converter can enlarge the value of the output capacitor, connects to the LED module, to about several Farads. This will lower the current that outputs to the LED. By comparing the prior arts, FIG. 6, and the present invention, FIG. 7, the ripple current of the LED device is about ±100% during 90 degree light dimming in the prior arts while in the present invention ripple current has been lowered to about ±40%. In addition to that, the output ripple current can be lowered by adjusting the output capacity which can be done based on the real situation.

It will be apparent to those skilled in the art that various modifications and variation can be made in the present invention without departing from the spirit or scope of the invention. Thus, it is intended that the present invention provided they come within the scope of the appended claims and their equivalents.

What is claimed is:

1. A driving circuit for a dimmable light emitting diode (LED) device with low ripple current, comprising:

a phase-modulating module for obtaining a phase-modulated AC voltage;

a voltage-converting module coupled to the phase-modulating module for converting the AC voltage to a first DC voltage;

a driving module coupled to the voltage-converting module for receiving the first DC voltage and driving a LED module, controlling one of an output current of the LED module based on phase-modulating information of the phase-modulating module; and wherein the voltage-converting module includes at least a secondary forward winding providing a detecting voltage as a reference level of the output current of the LED module, and a phase cut-off detecting circuit coupled to the at least a secondary forward winding.

2. A driving circuit for a dimmable light emitting diode (LED) device with low ripple current of claim 1, wherein the phase cut-off detecting circuit comprises:

a first resistor;

a second resistor, a first end of the second resistor connects to the first resistor, a second end of the second resistor connects to a ground;

a first transistor, a base of the first transistor connects to the first end of the second resistor, an emitter of the first transistor connects to the ground;

a third resistor, a first end of the third resistor connects to a first supply voltage, a second end of the third resistor connects to a collector of the first transistor;

a fourth resistor, a first end of the fourth resistor connects to the collector of the first resistor and the second end of the third resistor, a second end of the fourth resistor connects to the ground;

a second transistor, a gate of the second transistor connects to the first end of the fourth resistor, a source of the second transistor connects to the ground;

a fifth resistor, a first end of the fifth resistor connects to a drain of the second transistor, a second end of the fifth resistor connects to an output of the phase cut-off detecting circuit;

a second capacitor, a first end of the second capacitor connects to the second end of the fifth resistor and the output of the phase cut-off detecting circuit, a second end of the second capacitor connects to the ground;

a sixth resistor, a first end of the sixth resistor connects to a second supply voltage, a second end of the sixth resistor connects to the output of the phase cut-off detecting circuit; and a seventh resistor, a first end of the seventh resistor connects to the output of the phase cut-off detecting circuit, a second end of the seventh resistor connects to the ground.

3. A driving circuit for a dimmable light emitting diode (LED) device with low ripple current of claim 1, wherein the driving circuit includes a feedback module coupled to the driving module and the LED module for detecting the output current and providing output current information to the driving module and regulates the output current of the LED module.

4. A driving circuit for a dimmable light emitting diode (LED) device with low ripple current of claim 3, wherein the feedback module comprises:

a feedback resistor coupled to the LED module for producing a feedback voltage;

a control unit coupled to the feedback resistor and the LED module, based on the feedback voltage and the reference level, produces a control signal to regulating the output current of the LED module; and an optocoupler feedback unit coupled to the control unit, receiving the control signal and converting into the control signal into optical signal, providing the optical signal to the driving module.

5. A driving circuit for a dimmable light emitting diode (LED) device with low ripple current of claim 4, wherein the feedback resistor is coupled between the phase cut-off detecting circuit and the control unit for regulating the output current of the LED module.

6. A driving circuit for a dimmable light emitting diode (LED) device with low ripple current of claim 1, wherein the phase-modulating module includes an off-line phase dimmer.

7. A driving circuit for a dimmable light emitting diode (LED) device with low ripple current of claim 1, wherein the voltage-converting module includes a bridge-rectifier coupled to the phase-modulating module and a flyback converter for converting the phase-modulated AC voltage into the first DC voltage.

8. A driving circuit for a dimmable light emitting diode (LED) device with low ripple current of claim 7, wherein the flyback converter converts a level of the first DC voltage and outputs a second DC voltage to the LED module.

9. A driving circuit for a dimmable light emitting diode (LED) device with low ripple current of claim 8, wherein the flyback converter comprises:

a primary forward winding which receives the first DC voltage for converting the level of the first DC voltage and outputting the second DC voltage into a secondary side of the flyback converter; and a secondary reversing winding magnetically coupled to the primary forward winding for producing the second DC voltage.

10. A driving circuit for a dimmable light emitting diode (LED) device with low ripple current of claim 1, wherein the driving module includes a power factor correction IC (PFCIC) coupled to the voltage-converting module for increasing a power factor of the voltage-converting module and also provides a on-off signal for driving the LED module; and a power switch coupled to the flyback converter, based on the signal provided from the PFCIC for driving the LED module.

11. A dimmable light emitting diode (LED) device with low ripple current, comprising:

a LED module;

a phase-modulating module for obtaining a phase-modulated AC voltage;

a voltage-converting module coupled to the phase-modulating module for converting the AC voltage to a first DC voltage;

a driving module coupled to the voltage-converting module for receiving the first DC voltage and driving the LED module, controlling one of an output current of the LED module based on phase-modulating information of the phase-modulating module; and wherein the voltage-converting module includes at least a secondary forward winding providing a detecting voltage as a reference level of the output current of the LED module. and a phase cut-off detecting circuit coupled to the at least a secondary forward winding.

12. A dimmable light emitting diode (LED) device with low ripple current of claim 11, wherein the phase cut-off detecting circuit comprises:

a first resistor;

a second resistor, a first end of the second resistor connects to the first resistor, a second end of the second resistor connects to a ground;

a first transistor, a base of the first transistor connect to the first end of the second resistor, an emitter of the first transistor connects to the ground;

a third resistor, a first end of the third resistor connects to a first supply voltage, a second end of the third resistor connects to a collector of the first transistor;

a fourth resistor, a first end of the fourth resistor connects to the collector of the first resistor and the second end of the third resistor, a second end of the fourth resistor connects to the ground;

a second transistor, a gate of the second transistor connects to the first end of the fourth resistor, a source of the second transistor connects to the ground;

a fifth resistor, a first end of the fifth resistor connects to a drain of the second transistor, a second end of the fifth resistor connects to an output of the phase cut-off detecting circuit;

a second capacitor, a first end of the second capacitor connects to the second end of the fifth resistor and the output of the phase cut-off detecting circuit, a second end of the second capacitor connects to the ground;

a sixth resistor, a first end of the sixth resistor connects to a second supply voltage, a second end of the sixth resistor connects to the output of the phase cut-off detecting circuit; and a seventh resistor, a first end of the seventh resistor connects to the output of the phase cut-off detecting circuit, a second end of the seventh resistor connects to the ground.

13. A dimmable light emitting diode (LED) device with low ripple current of claim 11, further comprising a feedback module which comprises:

a feedback resistor coupled to the LED module for producing a feedback voltage;

a control unit coupled to the feedback resistor and the LED module, based on the feedback voltage and the reference level, produces a control signal to regulating the output current of the LED module; and an optocoupler feedback unit coupled to the control unit, receiving the control signal and converting into the control signal into optical signal, providing the optical signal to the driving module.

14. A dimmable light emitting diode (LED) device with low ripple current of claim 13, wherein the feedback resistor is coupled between the phase cut-off detecting circuit and the control unit for regulating the output current of the LED module.

15. A dimmable light emitting diode (LED) device with low ripple current of claim 11, wherein the phase-modulating module includes an off-line phase dimmer.

16. A dimmable light emitting diode (LED) device with low ripple current of claim 11, wherein the voltage-converting module includes a bridge-rectifier coupled to the phase-modulating module and a flyback converter for converting the phase-modulated AC voltage into the first DC voltage.

17. A dimmable light emitting diode (LED) device with low ripple current of claim 16, wherein the flyback converter converts a level of the first DC voltage and outputs a second DC voltage to the LED module.

18. A dimmable light emitting diode (LED) device with low ripple current of claim 17, wherein the flyback converter comprises:

a primary forward winding which receives the first DC voltage for converting the level of the first DC voltage and outputting the second DC voltage into a secondary side of the flyback converter; and a secondary reversing winding magnetically coupled to the primary forward winding for producing the second DC voltage.

19. A dimmable light emitting diode (LED) device with low ripple current of claim 11, wherein the driving module includes a power factor correction IC (PFCIC) coupled to the voltage-converting module for increasing a power factor of the voltage-converting module and also provides a on-off signal for driving the LED module; and a power switch coupled to the flyback converter, based on the signal provided from the PFCIC for driving the LED module.

* * * * *